(12) United States Patent
Christiansen et al.

(10) Patent No.: US 6,833,332 B2
(45) Date of Patent: Dec. 21, 2004

(54) METHOD FOR FABRICATION OF RELAXED SIGE BUFFER LAYERS ON SILICON-ON-INSULATORS AND STRUCTURES CONTAINING THE SAME

(75) Inventors: Silke H. Christiansen, Erlangen (DE); Alfred Grill, White Plains, NY (US); Patricia M. Mooney, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 10/323,024

(22) Filed: Dec. 18, 2002

(65) Prior Publication Data

US 2003/0127646 A1 Jul. 10, 2003

Related U.S. Application Data

(62) Division of application No. 10/037,611, filed on Jan. 4, 2002, now Pat. No. 6,515,335.

(51) Int. Cl.[7] .............................................. H01L 21/26
(52) U.S. Cl. ........................................ 438/796; 438/797
(58) Field of Search .......................... 438/93, 752, 933, 438/285, 518, 572, 590, 602, 767, 779, 796, 797

(56) References Cited

U.S. PATENT DOCUMENTS

| 5,221,413 A | 6/1993 | Braen et al. |
| 5,356,821 A | 10/1994 | Naruse et al. |
| 5,442,205 A | 8/1995 | Braen et al. |
| 5,461,243 A | 10/1995 | Ek et al. |
| 5,578,521 A * | 11/1996 | Suzuki et al. ................. 117/94 |
| 5,891,769 A | 4/1999 | Law et al. |
| 6,039,803 A | 3/2000 | Fitzgerald et al. |
| 6,117,750 A | 9/2000 | Bensahel et al. |
| 6,369,438 B1 | 4/2002 | Sugiyama et al. |
| 6,570,187 B1 * | 5/2003 | Pautrat et al. ................. 257/79 |
| 2002/0017642 A1 | 2/2002 | Mizushima et al. |
| 2002/0028531 A1 | 3/2002 | Wang et al. |

FOREIGN PATENT DOCUMENTS

| JP | 9-283533 | 10/1997 | |
| JP | 10209427 A * | 8/1998 | .......... H01L/29/06 |
| JP | P2001-168342 A | 6/2002 | |
| WO | WO 99/38201 | 7/1999 | |

OTHER PUBLICATIONS

D.M. Follstaedt, et al., "Interaction of Cavities with Misfit Dislocations in SiGe/Si Heterostructures", Nuclear Instruments and Methods in Physics Research B 127/218, 1997 (pp. 375–378).

(List continued on next page.)

Primary Examiner—Paul E. Brock, II
(74) Attorney, Agent, or Firm—Scully, Scott, Murphy and Presser; Robert M. Trepp

(57) ABSTRACT

A method of fabricating relaxed SiGe buffer layers with low threading dislocation densities on silicon-on-insulator (SOI) substrates is provided. The relaxed SiGe buffer layers are fabricated by the epitaxial deposition of a defect-free Stranski-Krastanov Ge or SiGe islands on a surface of the SOI substrate; the capping and planarizing of the islands with a Si or Si-rich SiGe layer, and the annealing of the structure at elevated temperatures until intermixing and thereby formation of a relaxed SiGe layer on the insulating layer (i.e., buried oxide layer) of the initial SOI wafer is achieved. The present invention is also directed to semiconductor structures, devices and integrated circuits which include at least the relaxed SiGe buffer layer mentioned above.

39 Claims, 12 Drawing Sheets

OTHER PUBLICATIONS

S. Mantl, et al., "Strain Relaxation of Epitaxial SiGe Layers on Si(100) Improved by Hyrdrogen Implantation", Nuclear Instruments and Methods in Physics Research B 147, 1999 (pp. 29–34).

B. Holländer, et al., "Strain Relaxation of Pseudomorphic $Si_{1-x}Ge_x$/Si(100) Heterostructures After Hydrogen or Helium Ion Implantation for Virtual Substrate Fabrication", Nuclear Instruments and Methods in Physics Research B 175–177, 2001 (pp. 357–367).

P.M. Mooney, "Strain Relaxation and Dislocations in SiGe/Si Structures", Materials Science & Engineering, Reports: A Review Journal, vol. R17, No. 3, Nov. 1, 1996.

N. Sugiyama, et al., "Formation of Strained–Silicon Layer on Thin Relaxed $SiGe/SiO_2$/Si Structure Using SIMOX Technology", Thin Solid Films 369, 2000 (pp. 199–202).

G. Höck, et al., "Carrier Mobilities in Modulation Doped $Si_{1-x}Ge_x$ Heterostructures with Respect to FET Applications", Thin Solid Films 336, 1998 (pp 141–144).

S. Christiansen, et al., "Reduced Effective Misfit in Laterally Limited Structures Such As Epitaxial Islands", American Institute of Physics, 1995 (pp. 574–576).

E.A. Fitzgerald, et al., "Totally Relaxed $Ge_xSi_{1-x}$ Layers with Low Threading Dislocation Densities Grown on Si Substrates", Appl. Phys. Lett., vol. 59, No. 7, Aug. 12, 1991 (pp. 811–813).

G. Kissenger, et al., Stepwise Equilibrated Graded $Ge_xSi_{1-x}$ Buffer with Very Low Threading Dislocation Density on Si(100), American Institute of Physics, 1995 (pp. 2083–2085).

T. Hackbarth, et al., "Alternatives to Thick MBE–Grown Relaxed SiGe Buffers", Thin Solid Films 369, 2000 (pp. 148–151).

H. Trinkaus, "Strain Relaxation Mechanism for Hydrogen–Implanted $Si_{1-x}Ge_x$/Si(100) Heterostructures", Applied Physics Letters, vol. 76, No. 24, 2000 (pp. 3552–3554).

D.M. Follstaedt, et al., "Cavity–Dislocation Interactions in Si–Ge and Implications for Heterostructure Relaxation", Applied Physics Letters, vol. 69, No. 14, Sep. 30, 1996 (pp. 2059–2061).

G. Wöhl, et al., "Relaxed $Si_{0.7}Ge_{0.3}$ Buffer Layers Grown on Patterned Silicon Substrates for SiGe N–Channel HMOS-FET's", Thin Solid Films 369, 2000 (pp. 175–181).

Kasper, et al., "Properties of Silicon Germanium and SiGe: Carbon", University of Stuttgart, Germany.

E.A. Stach, et al., "In–situ Transmission Electron Microscopy Studies of the Interaction Between Dislocations in Strained SiGe/Se(001) Heterostructures", Philosophical Magazine A, 2000, vol. 80, No. 9 (pp. 2159–2200).

O.G. Schmidt, et al., "Long–Range Ordered Lines of Self–Assembled Ge Islands on a Flat Si (001) Surface", Applied Physics Letters, vol. 77, No. 5, 2000 (p. 4139–4141).

O.G. Schmidt, et al., "Reduced Critical Thickness and Photoluminescence Line Splitting in Multiple Layers of Self–Assembled Ge/Si Islands", Materials Science and Engineering B74, 2000 (pp. 248–252).

A.A. Darhuber, et al., "High–Resolution X–ray Diffraction from Multilayered Self–Assembled Ge Dots", Physical Review B, vol. 55, No. 23, Jun. 15, 1997 (pp. 15 652–15 663).

Vinh Le Thanh, et al., "Strain–Driven Modification of the Ge/Si Growth Mode in Stacked Layers: A Way to Produce Ge Islands Having Equal Size in all Layers", Thin Solid Films 36, 2000 (pp. 43–48).

* cited by examiner

METHOD FOR FABRICATION OF RELAXED SIGE BUFFER LAYERS ON SILICON-ON-INSULATORS AND STRUCTURES CONTAINING THE SAME

RELATED APPLICATIONS

This application is a divisional of U.S. application Ser. No. 10/037,611, filed Jan. 4, 2002 now U.S. Pat. No. 6,515,335.

FIELD OF THE INVENTION

The present invention relates to semiconductor structures, and more particularly to a semiconductor structure which comprises at least one relaxed SiGe buffer layer formed on a silicon-on-insulator (SOI) substrate. The present invention is also directed to a method of fabricating at least one relaxed SiGe buffer layer having low threading dislocation (TD) densities on a SOI substrate.

BACKGROUND OF THE INVENTION

The implementation of a strain-relaxed SiGe buffer layer (SiGeBL) in a heterostructure that contains at least one SiGe/Si interface, e.g., SiGe/Si(001) or SiGe/Si/SiO$_2$/Si (001) (i.e., SiGe on SOI), offers a new degree of freedom in strain and band structure engineering. The tensile biaxial strain in a Si layer deposited on top of a SiGeBL leads to a conduction band offset at the interface that enables the formation of a two-dimensional-electron gas in a Si-quantum well (See, for example, K. Ismail, et al., Appl. Phys. Lett. 66, 1077 (1995) and U.S. Pat. No. 5,534,713 to K. Ismail, et al.). Extremely high electron mobility (about 5 times the value in bulk) has been measured at room temperature in tensile strained Si channels grown epitaxially on SiGeBLs (See, for example, K. Ismail ibid., or G. Hoeck, et al., Thin Solid Films 336, 1999 (2000)).

High frequency device characteristics demonstrate the outstanding potential of the SiGe/Si system. The state-of-the-art technique to produce high-quality SiGeBLs comprises the growth of several micrometer thick composition-ally step-graded layers (with a typical Ge mole fraction of less than about 40%). Strain relaxation occurs by the formation of 60° misfit dislocations at the SiGe/Si interface that terminate with threading dislocations (TDs) that thread through the SiGe layers at the wafer surface. Such strain-relaxed layers therefore have a TD density of about $10^4$–$10^7$ cm$^{-2}$ (depending on the alloy composition) at the surface of the uppermost layer (See, for example, F. K. LeGoues, J. Appl. Phys. 71, 4230 (1992); U.S. Pat. No. 5,659,187 to F. K. LeGoues, et al.; E. A. Fitzgerald, et al., Appl. Phys. Lett. 59, 811 (1991); and G. Kissinger, et al., Appl. Phys. Lett. 66, 2083 (1995)).

The major drawbacks of prior art thick SiGeBLs (usually 1–5 micrometer thickness is necessary to obtain full strain relaxation with these relatively low TD densities) include: (1) the high TD density; and (2) the inhomogeneous distribution of TDs over the wafer surface, i.e., regions that have relatively low TD densities with primarily individual TDs and other areas that contain bundles of TDs that result from dislocation interactions such as blocking, multiplication, or dipole formation. As a result of dislocation blocking, surface pits that tend to line up in rows are found, thus making these regions of the wafer unusable for devices. (3) The thick graded SiGeBLs also result in self-heating effects in the devices because Ge has a lower thermal conductivity than Si. This makes devices fabricated on prior art SiGeBLs unsuitable for some applications.

Various prior art strategies have been developed to reduce the TD density. Such prior art strategies for reducing TD density include: (1) the use of an initial low-temperature buffer layer (See, for instance, T. Hackbath, et al. Thin Solid Films 339, 148 (2000); and (2) the use of hydrogen or helium implantation below the interface of a pseudomorphic SiGe layer on a Si substrate and subsequent annealing to create bubbles that give rise to heterogeneous dislocation nucleation. (See, H. Trinkaus, et al., Appl. Phys. Lett. 76, 3552 (2000) and D. M. Follstaedt, et al., Appl. Phys. Lett. 69, 2059 (1996)).

Prior art approaches (1) and (2) mentioned-above, are both based on the idea of creating extended defects that cause strain fields and thus enable the nucleation of dislocation loops. These loops extend to the SiGe/Si interface where they deposit a misfit dislocation segment and relieve strain. Since the half-loops terminate at these extended defects below the SiGe/Si interface, TDs are typically not formed (or are formed at much reduced densities).

A third prior art approach utilizes substrate patterning, e.g., etched trenches, to create comparatively small mesas on the order of about 10 to about 30 micrometers on a side. These trenches serve as a source (or a sink) for dislocations to nucleate/terminate. When a dislocation terminates at a trench, no TD is formed; however, the misfit segment present at the SiGe/Si interface contributes to strain relaxation; See, for instance, G. Woehl, et al. Thin Solid Films 369, 175 (2000).

Neither the conventional approaches to SiGeBLs, nor the alternative approaches to reduce the density of TDs described above provide a solution that fully satisfies the material demands for device applications, i.e., sufficiently low TD density and control over location of the TDs. In view of this, there is still a need for providing an alternative approach for fabricating strain-relaxed SiGeBLs on an SOI substrate that keeps the surface of the relaxed SiGeBL on which the actual device layers are subsequently deposited, essentially free of dislocations throughout all processing steps required to fabricate devices and circuits.

SUMMARY OF THE INVENTION

The present invention provides a method that keeps the topmost SiGe layer essentially free of dislocations, throughout all processing steps employed providing, nevertheless, at least one relaxed SiGeBL on an SOI substrate. This is achieved in the present invention by employing a method wherein a combined epitaxial growth and annealing procedure is employed.

Broadly speaking, the method of present invention comprises the steps of:

(a) forming a layer of self-assembled Ge or SiGe islands atop a Ge wetting layer which is formed on a top Si layer of a silicon-on-insulator (SOI) substrate;

(b) forming a planarizing Si or Si-rich SiGe cap layer which covers the layer of Ge or SiGe islands; and (c) annealing the silicon-on-insulator substrate containing said planarizing Si or Si-rich SiGe cap layer covering said layer of Ge or SiGe islands so as to intermix said planarizing Si or Si-rich cap layer, said layer of Ge or SiGe islands and said top Si layer of the SOI substrate to relieve strain therein, thereby obtaining a homogeneous strain-relaxed SiGe layer directly on an oxide layer having a low density of threading dislocations.

The term "low density of threading dislocations" is used herein to denote a structure wherein the TDs density is on the order of about $10^7$ cm$^{-2}$ or less, with a density of from about $10^3$ to about $10^6$ cm$^{-2}$ being more highly preferred. The SiGe islands contain from about 30 atomic percent or greater Ge. The term "Si-rich" cap layer denotes a cap layer that contains from about 90 atomic percent or greater Si.

In some embodiments of the present invention, a wetting layer consisting of a few monolayers of Ge are formed on the top Si layer prior to the formation of the layer of self-assembled Ge or SiGe islands. In another embodiment, an island nucleation layer comprised of less than one monolayer of C is formed on the top Si layer prior to formation of the wetting layer and/or the formation of the layer of self-assembled Ge or SiGe islands.

Another aspect of the present invention relates to a semiconductor structure which includes at least one strain-relaxed SiGe buffer layer formed utilizing the above processing steps on a surface of a SOI substrate.

Specifically, the inventive structure comprises:

a substrate having a top surface;

a first insulating layer atop of said substrate;

a first single crystalline relaxed SiGe layer atop said first insulating layer, wherein said first single crystalline relaxed SiGe layer has a uniform composition, is less than 200 nm thick, and has a threading dislocation density of less than about $10^7$ cm$^{-2}$.

In some embodiments of the present invention, an optional intermediate layer which consists of a single crystalline relaxed SiGe layer of graded composition comprising between 0 atomic % Ge and the same atomic concentration of Ge present in the first single crystalline relaxed SiGe layer is formed atop the insulating layer. In such an embodiment, the first single crystalline relaxed SiGe layer is formed atop the optional intermediate layer.

In yet another embodiment of the present invention, a layer of homo-epitaxial SiGe layer is formed atop the first single crystalline relaxed SiGe layer. In yet another embodiment of the present invention, a layer of strained single crystalline SiGe or single crystalline Si containing zero atomic percent Ge is pseudomorphically formed atop the first single crystalline relaxed SiGe layer. In a further embodiment of the present invention, both the homo-epitaxial SiGe layer and the strained single crystalline pseudomorphically formed SiGe or Si layer are present atop the first single crystalline relaxed SiGe layer.

The present invention also contemplates integrated circuits (ICs) which include at least the semiconductor structure of the present invention and at least one semiconductor device. The present invention also contemplates forming a superlattice structure containing alternating SiGe layers atop the semiconductor structures of the present invention.

BRIEF DESCRIPTION OF THE DRAWINGS

FIG. 1A is a cross-sectional showing pure Ge wetting layer 40 and Ge or SiGe island layer 50 capped by Si or Si-rich SiGe layer 60; FIG. 1B is a planar view of the wafer showing only islands 50 on wetting layer 40.

DETAILED DESCRIPTION OF THE INVENTION

Figure 1A:
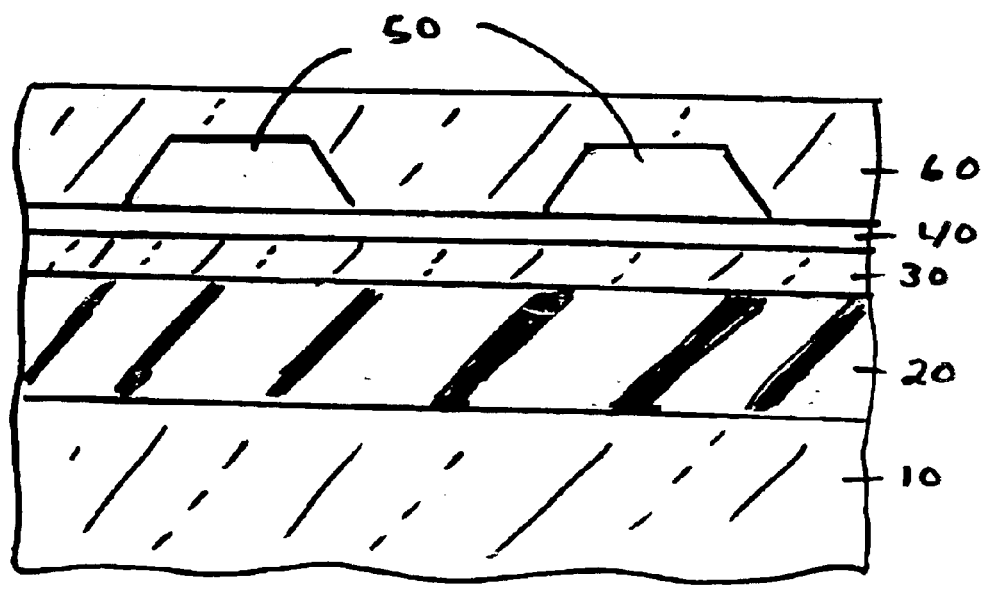
FIGS. 1A–1B are schematic drawings of capped Stranski-Krastanov Ge— or SiGe grown islands.

The present invention, which provides a method of fabricating at least one relaxed SiGe buffer layer on an SOI substrate as well as semiconductor structures and integrated circuits which include at least the relaxed SiGe layer formed atop an SOI substrate, will now be described in more detail by referring to the drawings that accompany the present application. It should be noted that in the drawings like and/or corresponding elements are referred to by like reference numerals.

Figure 1B:
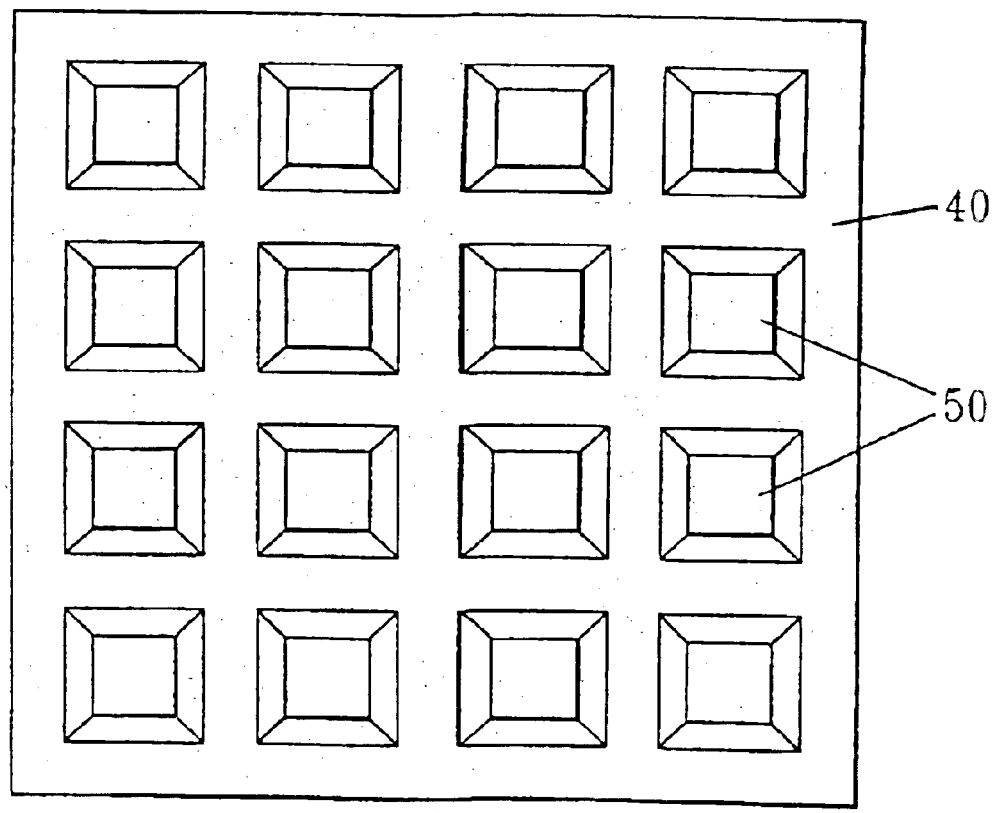

Reference is first made to FIG. 1A which shows a structure that is formed after conducting the epitaxial growing steps of the present invention. Specifically, FIG. 1A is a cross-sectional view of a structure which comprises an SOI substrate (consisting of Si substrate 10, buried oxide layer, i.e., first insulating layer, 20, and top Si layer 30), wetting layer 40 formed on top Si layer 30, a layer of self-assembled Ge or SiGe islands 50 formed on wetting layer 40 and planarizing Si or Si-rich SiGe cap layer 60 which covers the layer of Ge or SiGe islands. Note that in embodiments wherein the wetting layer is not discussed it is contained for simplification in the layer of self-assembled Ge or SiGe islands. FIG. 1B shows a planar view showing islands 50 atop wetting layer 40.

The various materials and processes used in forming the structure shown in FIG. 1A will now be described in more detail. Specifically, the SO substrate comprises a buried oxide layer that electrically isolates the Si substrate (i.e., bottom Si layer of the SOI substrate) from the top Si layer of the SOI substrate. The top Si layer is the layer of the SOI substrate in which active devices are typically formed therein. The SOI substrate may be formed utilizing conventional bonding and cutting processes well known in the art, or alternatively, the SOI substrate maybe formed utilizing a conventional separation by ion implantation of oxygen (SIMOX) process.

The thickness of the top Si layer of the SOI substrate is thin, typically on the order of from about 10 to about 150 nm, with a thickness of from about 10 to about 50 nm being more highly preferred. The buried oxide layer, on the other hand, has a thickness of from about 200 to about 1500 nm, with a thickness of from about 300 to about 400 nm being more highly preferred. The thickness of the Si substrate of the SOI substrate is inconsequential to the present invention.

In some embodiments of the present invention, and as shown in FIG. 1A, wetting layer 40 is formed on the surface of top Si layer 30 utilizing conventional ultra-high vacuum deposition processes well known in the art. The wetting layer may be formed by molecular beam epitaxy (MBE), chemical vapor deposition (CVD), plasma-enhanced chemical vapor deposition (PECVD), chemical beam epitaxy, plating, evaporation, sputtering, chemical solution deposition, and other like deposition processes. When present, the wetting layer comprises Ge, and it has a thickness that is less than about 10 monolayers. More preferably, the wetting layer has a thickness of about 8 monolayers or less.

In another embodiment not shown, a nucleation layer comprising C may be formed atop the top Si layer prior to the wetting layer and/or layer of Ge or SiGe islands. The C-nucleation layer, which has a thickness of about 1 monolayer or less, is formed utilizing a conventional ultra-high vacuum deposition process as mentioned above.

Self-assembled Ge or SiGe islands 50 are then formed on the top of Si layer 30 (not shown) utilizing any epitaxial growth method such as chemical vapor deposition (CVD), molecular beam epitaxy (MBE) or any of the other ultra-high vacuum deposition processes mentioned above. The growth temperatures as well as the deposition rates employed are adjusted depending on the specific growth method used. For example, when the Ge or SiGe islands are formed using CVD, the following deposition conditions are typically employed: deposition temperature of from about 300° to about 900° C., preferably from about 550° to about 700° C., and growth rate of from about 0.5 to about 5 Å/sec.

When the Ge or SiGe islands are formed using MBE, the following deposition conditions are typically employed: deposition temperature of from about 400° to about 800° C., preferably from about 425° to about 650° C., and growth rate of from about 0.1 to about 1 Å/sec.

It is noted that the above deposition conditions are exemplary and other deposition conditions that are capable of forming a layer of Ge or SiGe islands can also be employed in the present invention. The goal, independent of the growth method, is to grow a layer of high density pseudomorphic Ge or SiGe islands, i.e., a high density of islands that comprises from about 30 to about 100 atomic percent Ge, with a range of from about 40 to about 100 atomic percent Ge being more highly preferred. Note that at 100 atomic percent Ge, the island layer is composed of pure Ge, whereas at ranges between about 30 atomic percent Ge and 100 atomic percent Ge, the island layer is a SiGe layer. The thickness of the Ge or SiGe islands is from about 5 to about 80 nm, with a thickness of from about 10 to about 50 nm being more highly preferred.

In some embodiments of the present invention and as shown in FIG. 1A, the islands grow using thee so-called Stranski-Krastanov growth mode which is characterized by initial growth of a wetting layer of pure Ge of a few angstroms thick followed by the growth of an array of well separated, defect free islands. Stranski-Krastanov island growth occurs at a comparatively high lattice mismatch such as that occurring in the $Si_{1-x}Ge_x$/Si wherein x is approximately equal to or greater than 0.4. The driving force for island formation in the Stranski-Krastanov growth mode is elastic relaxation of the lattice mismatch strain. The small aspect ratio of the islands, i.e., width to height, of about 2 to about 2.5 results in elastic relaxation of up to about 70% of the lattice mismatch induced strain. Thus, islands that have an average height that is significantly larger than the critical thickness $h_c$ ($h_c$ of less than about 1 nm for pure Ge or extremely SiGe alloys) of a planar layer of the same alloy composition can be deposited. Due to elastic strain relaxation when island formation occurs, a larger volume of Ge material can be deposited free of dislocations than is possible for a planar layer.

After forming the layer of Ge or SiGe islands on the structure, planarizing Si or Si-rich cap layer 60 is formed utilizing the same or different epitaxially growth method, i.e., CVD or MBE, as the Ge or SiGe islands. The planarizing Si or Si-rich SiGe cap layer typically comprises from about 0 to about 10 atomic percent Ge, with a concentration of from about 0 to about 5 atomic percent Ge being more highly preferred. Note at 0 atomic percent Ge, cap layer 60 is composed of pure Si, whereas at ranges between about 10 atomic percent to about 0 atomic percent Si, cap layer 60 is a Si-rich cap layer.

The growth temperature as well as the deposition rate depends on the growth method employed. Typically, the same conditions as mentioned in connection with the Ge or SiGe islands can also be used in forming the Si or Si-rich SiGe cap layer. The cap layer is as thin as possible, but must be thick enough to fully cover the islands and planarize the wafer. Typically, cap layer 50 has a thickness of from about 6 to about 100 nm, with a thickness of from about 8 to about 81 nm being more highly preferred.

It should be noted that when an optional C nucleation layer is employed, then the Ge or SiGe islands have a thickness of from about 3 to about 30 nm and the Si or Si-rich cap layer has a thickness of from about 4 to about 50 nm.

The driving force for planarization of the cap layer is the heterogeneous strain distribution along the SiGe or Ge island layer that has regions of compressive strain in the troughs between islands and regions on top of the islands that are relaxed towards the equilibrium SiGe or Ge lattice constant. Thus, adatom incorporation during deposition of the cap layer has a different probability on the top of the islands than between the islands. The growth rate for a Si layer is enhanced in the regions between islands that remain compressively strained and are therefore closer to the equilibrium lattice constant of Si or Si-rich SiGe.

The structure shown in FIG. 1A, i.e., planarizing cap layer 60, layer Ge or SiGe islands 50, wetting layer 40 and SOI substrate, is then annealed at elevated temperatures so as to cause intermixing between layers 60, 50, 40 and 30, i.e., between the Si cap, the Ge islands, wetting layer and the top Si layer of the SOI substrate. Specifically, annealing is performed in an inert gas (such as Ar, He, $N_2$, Kr, Ne or Xe), a forming gas or an oxidizing ambient at temperatures of from about 400° to about 1400° C. More specifically, the annealing is carried out at a temperature of from about 800° to about 1250° C. The time period for the annealing step may vary, but typically annealing is performed at a desired temperature for a time period of from about 0.5 to about 15 hours, with a time period of from about 2 to about 8 hours being more highly preferred.

Note that the annealing step may be carried out using a rapid thermal annealing process or a furnace annealing process. Rapid thermal annealing is typically carried out at shorter periods of time as compared with furnace annealing.

The annealing may also be carried out using a single temperature, or various ramp and soak cycles may be used during the annealing step.

Figure 2:
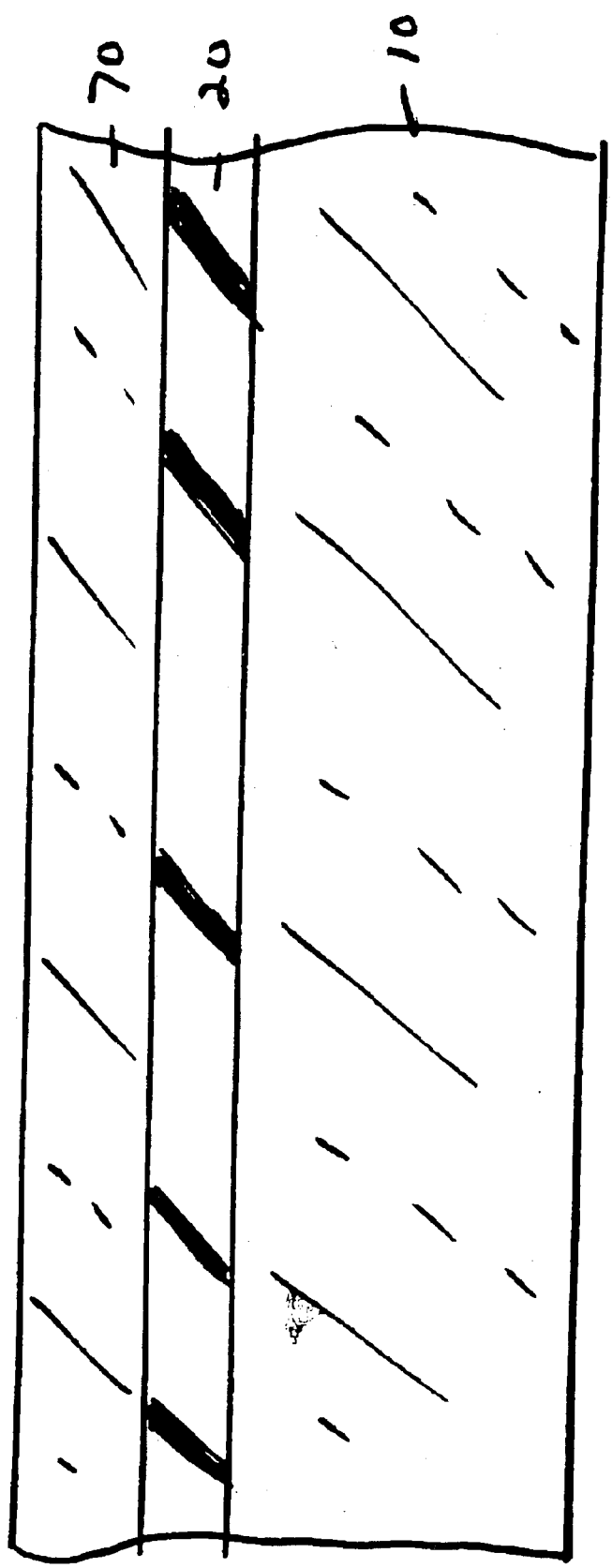
FIG. 2 is a schematic view of the cross-section of FIG. 1 after annealing.

FIG. 2 shows the structure of FIG. 1A after the annealing step has been completed. Specifically, during annealing layers 30, 40, 50 and 60 intermix and are converted to first single crystalline SiGe layer 70 which has a uniform composition associated therewith. The thickness of layer 70 formed after annealing may vary, but typically, the newly formed first single crystalline SiGe layer has a thickness of from about 15 to about 200 nm, with a thickness of from about 50 to about 100 nm being more highly preferred.

First single crystalline SiGe layer 70, which is formed by intermixing of the various layers shown in FIG. 1A, typically comprises from about 5 to about 40, preferably from about 15 to about 35, atomic percent Ge and a threading dislocation density of less than about $10^7$ cm$^{-2}$, with a threading dislocation density of from about $10^3$ to about $10^6$ cm$^{-2}$ being more highly preferred.

It is noted that one major advantage in using the island layer rather than a planar Ge or SiGe on an SOI substrate is that the driving force for intermixing is much higher in capped island layers and intermixing is faster since it takes place in three dimensions rather than at a planar surface. Furthermore, it is less likely that undesired dislocations form upon annealing, since intermixing is the means to relax the overall strain of the system. Finite element calculations have shown that the system energy is reduced by intermixing of the capped islands. A consideration of the total energy of the system indicates that a planar SiGe alloy layer system has a lower energy by 20% than the SiGe island layer that is capped by a pure Si layer, comparing layers of the same volume and the same Ge mole fraction. In contrast, an uncapped Ge or SiGe island layer on a Si substrate has a lower total energy than a planar SiGe layer of the same volume and same composition since the island layer is partially relaxed elastically.

From these finite element calculations, it can be deduced that a capped island layer will have an enhanced driving force for intermixing of the islands and cap compared to the intermixing of two planar layers of Si and Ge. Another important advantage of the capped island layer is that a higher content of Ge in a thinner layer can be achieved. This is because the deposition of a planar SiGe layer is limited by the critical thickness which decreases with increasing Ge content. Strain-driven intermixing occurs over a wide temperature range beginning at temperatures as low as 400° C. Since a homogeneous mixture of Si and Ge is desirable, i.e., intermixing with the thin Si layer of the SOI substrate as well as the islands and cap layer, it is favorable to go to higher temperatures wherein shorter annealing times may be employed. Note that the upper limit for the annealing temperature is roughly the melting point of the Si. However, it has been observed that precipitates may form in films that are annealed at temperatures higher than 1250° C. This indicates that annealing too close to the melting point may result in a lower quality film. Therefore, temperatures within a suitable range may be employed in the present invention, with annealing times adjusted accordingly.

The above provides a basic description of the processing steps employed in the present invention. It is noted that the processing steps of the present invention, i.e., formation of wetting layer, epitaxial Ge or SiGe island growth, epitaxial growth of a capping layer and intermixing upon annealing may be repeated any number of times. For example, the various processing steps of the present invention may be repeated up to ten times. Additionally the steps of wetting layer formation, epitaxial growth of Ge or SiGe islands and epitaxial growth of planarizing Si or Si-rich SiGe cap layer may be repeated any number of times prior to annealing, as often as the critical thickness limit permits.

The following descriptions, with reference to FIGS. 3–12, provide additional embodiments that are also within contemplation of the present invention.

Figure 3:
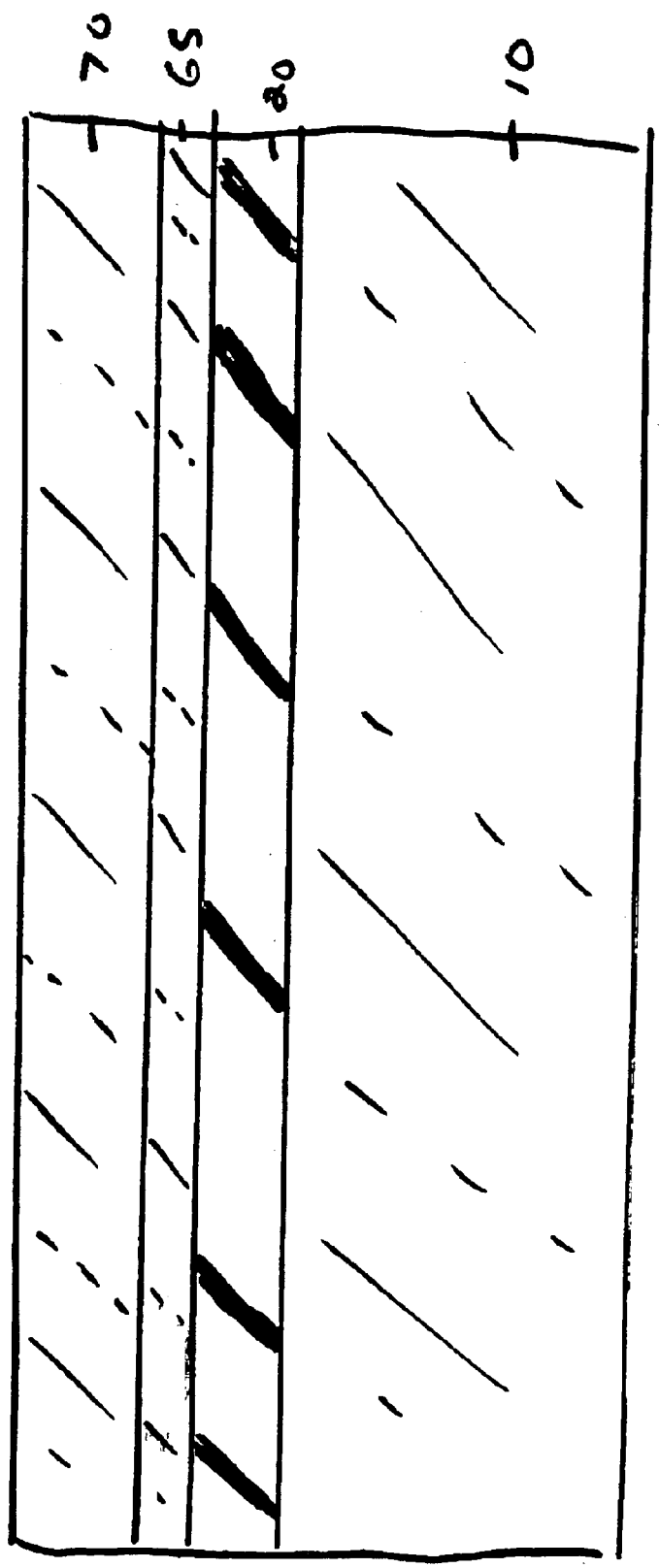
FIG. 3 is a schematic view of the cross-section of FIG. 2 further comprising optional graded SiGe layer 65.

Specifically, FIG. 3 shows an annealed structure of the present invention which includes Si substrate 10, buried oxide region 20, optional graded SiGe layer 65 and intermixed first single crystalline SiGe layer 70. The structure containing the optional graded SiGe layer is formed in instances wherein the initial top Si layer is thick enough so that after intermixing a graded SiGe layer is formed.

The optional graded SiGe layer has an atomic composition of from about 0 atomic percent Ge to the same atomic percent of Ge present in the first single crystalline relaxed SiGe layer, with an atomic percent of Ge of from about 15 to about 40 being more highly preferred. The thickness of the optional graded SiGe layer is from about 0 to about 50 nm, with a thickness of from about 1 to about 20 nm being more highly preferred.

Figure 4:
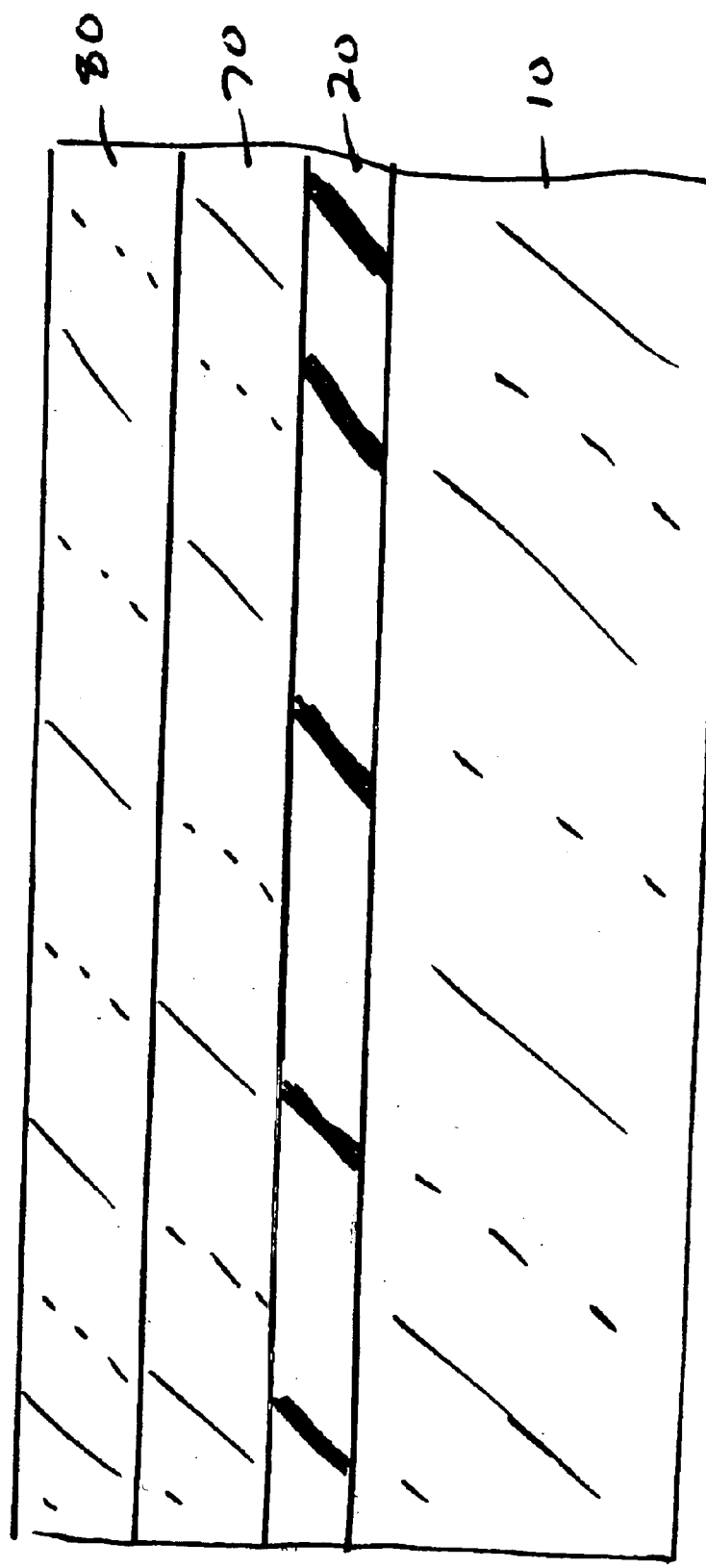
FIG. 4 is a schematic of the cross-section of FIG. 2 wherein second single crystalline SiGe layer 80 of identical composition to first single crystalline SiGe layer 70 is deposited homo-epitaxially on layer 70.

FIG. 4 illustrates an embodiment wherein a second single crystalline SiGe layer 80 of identical composition as first single crystalline SiGe layer 70 is formed homo-epitaxially using the method of the present invention on layer 70. The optional graded SiGe layer 65 may also be present in the structure illustrated in FIG. 4. The thickness of layer 80 is from about 100 to about 1000 nm, with a thickness of from about 200 to about 400 nm being more highly preferred. Note that the TD density in layer 80 is typically not higher than that of layer 70.

Figure 5:
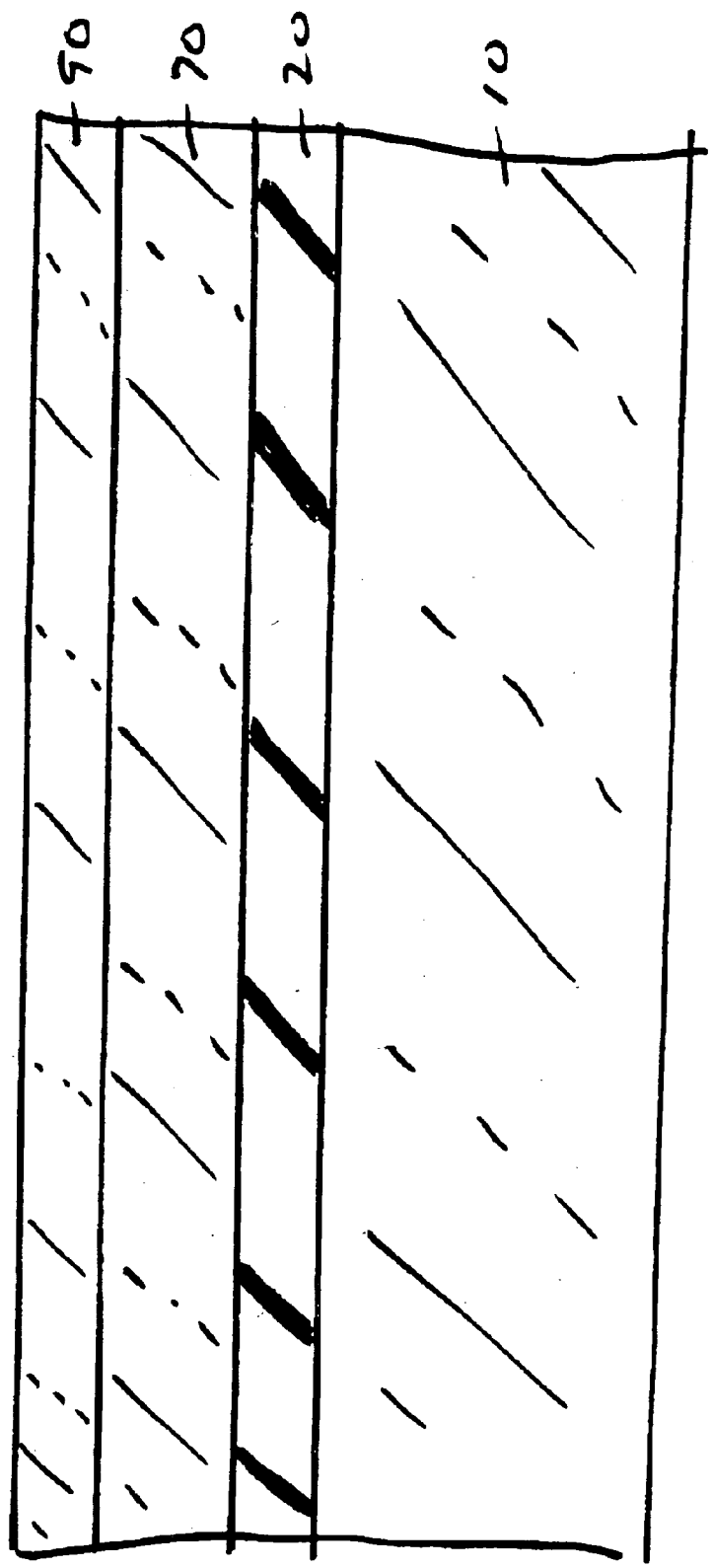
FIG. 5 is a schematic of a cross-sectional view of a structure wherein a strained pseudomorphic epitaxial Si layer 90 is deposited atop of the structure shown in FIG. 2.

FIG. 5 illustrates a structure where strained pseudomorphic epitaxial Si layer 90 is deposited on top of the structure shown in FIG. 2. The strained pseudomorphic epitaxial Si layer has a thickness after deposition of from about 7 to about 40 nm, with a thickness of from about 10 to about 20 nm being more highly preferred. The optional graded SiGe layer may also be present in this structure as well.

Figure 6:
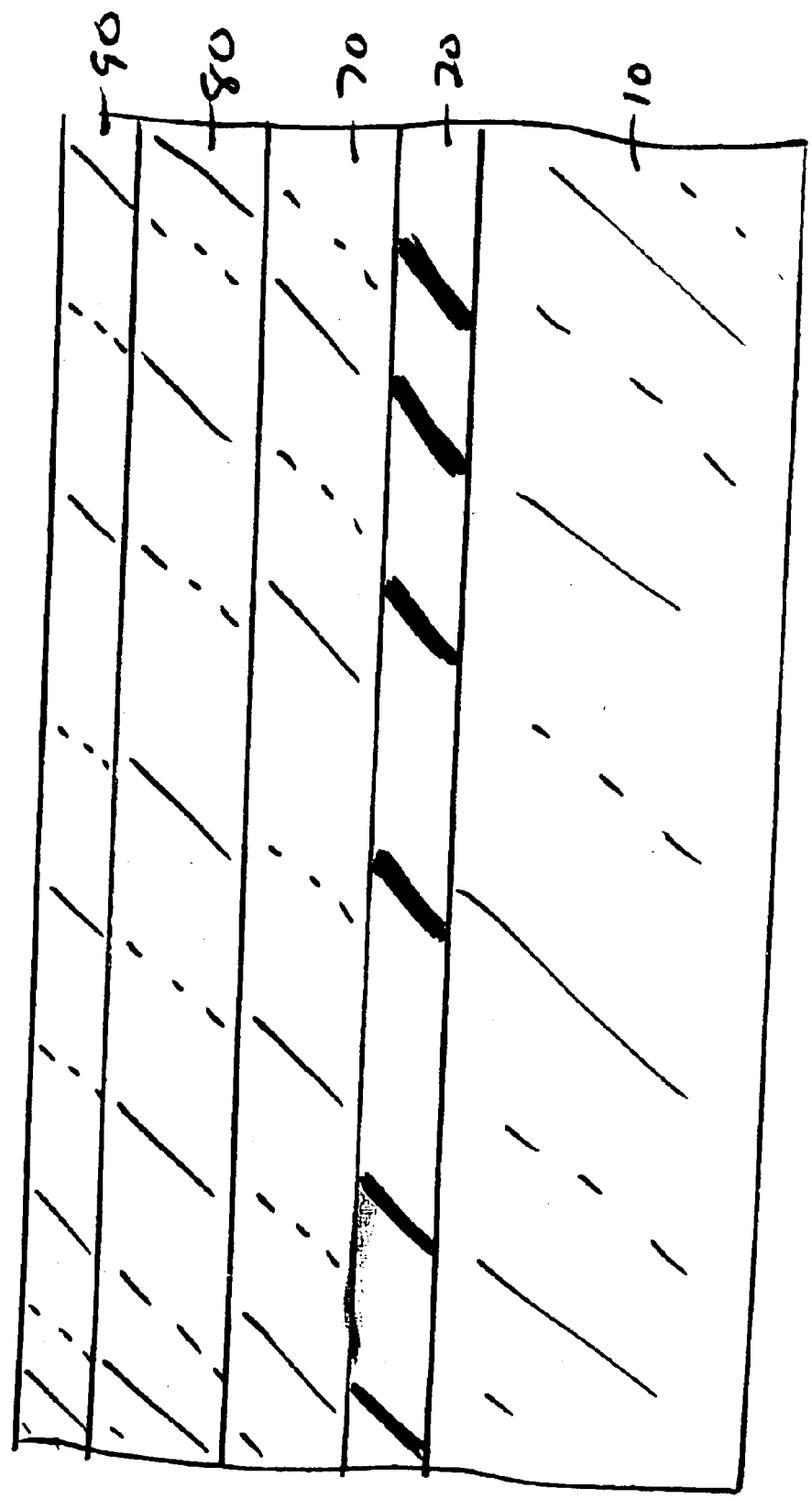
FIG. 6 is a schematic of a cross-sectional view of a structure wherein a strained pseudomorphic epitaxial Si layer 90 is deposited atop of the structure shown in FIG. 4.

FIG. 6 illustrates a structure wherein strained pseudomorphic epitaxial Si layer 90 is formed on top of the structure shown in FIG. 4, i.e., atop second single crystalline SiGe layer 80. The optional graded SiGe layer may also be present in the structure shown in FIG. 6.

Figure 7:
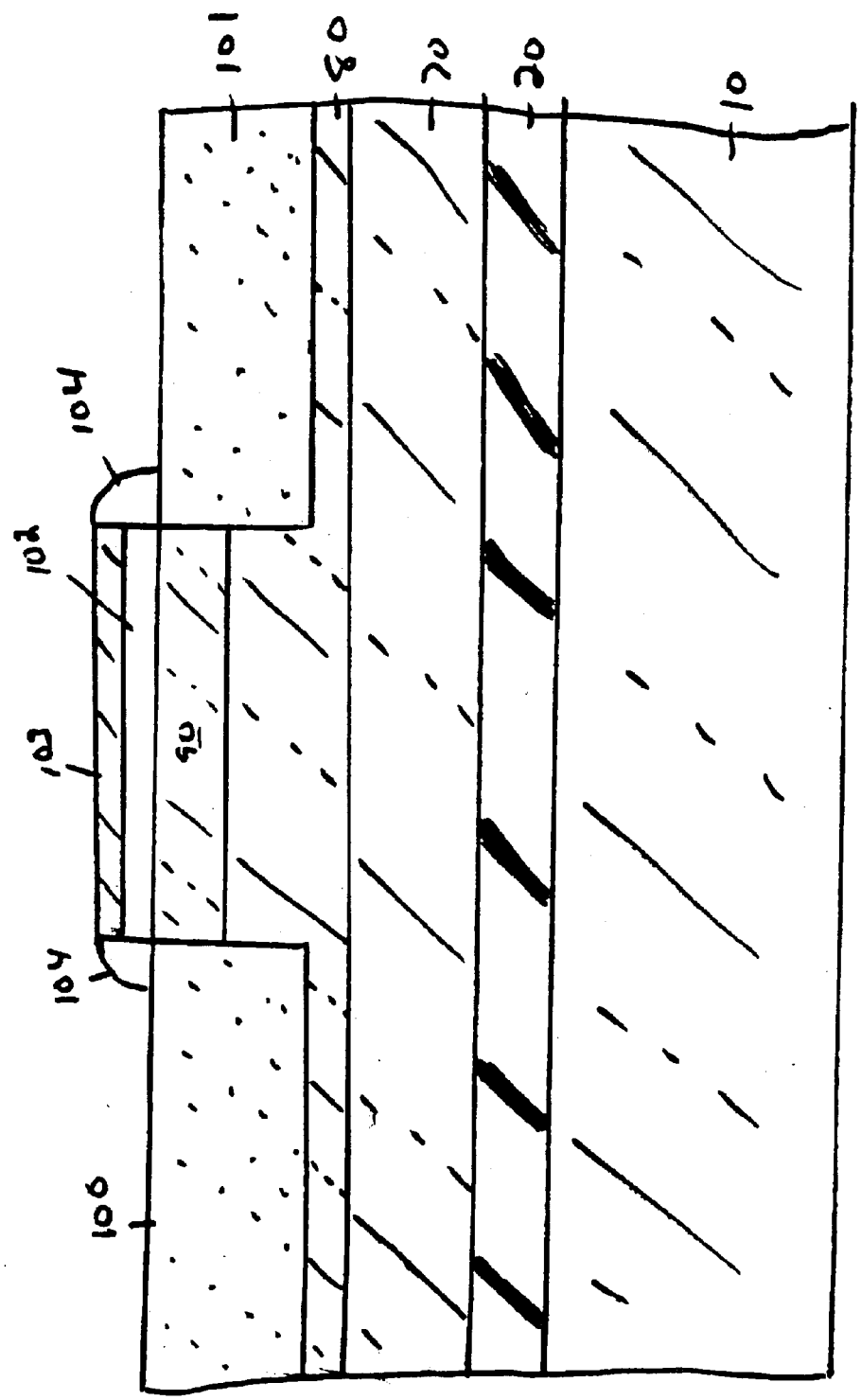
FIG. 7 is a schematic of a cross-sectional view wherein a field effect transistor (FET) is fabricated on the structure of FIG. 6.

FIG. 7 is a structure where a field effect transistor (FET) is fabricated on the structure shown in FIG. 6 using complementary metal oxide semiconductor (CMOS) processing steps well known in the art. The field effect transistor includes source/drain diffusion regions 100 and 101, gate dielectric 102, gate conductor 103 and sidewall spacers 104.

Figure 8:
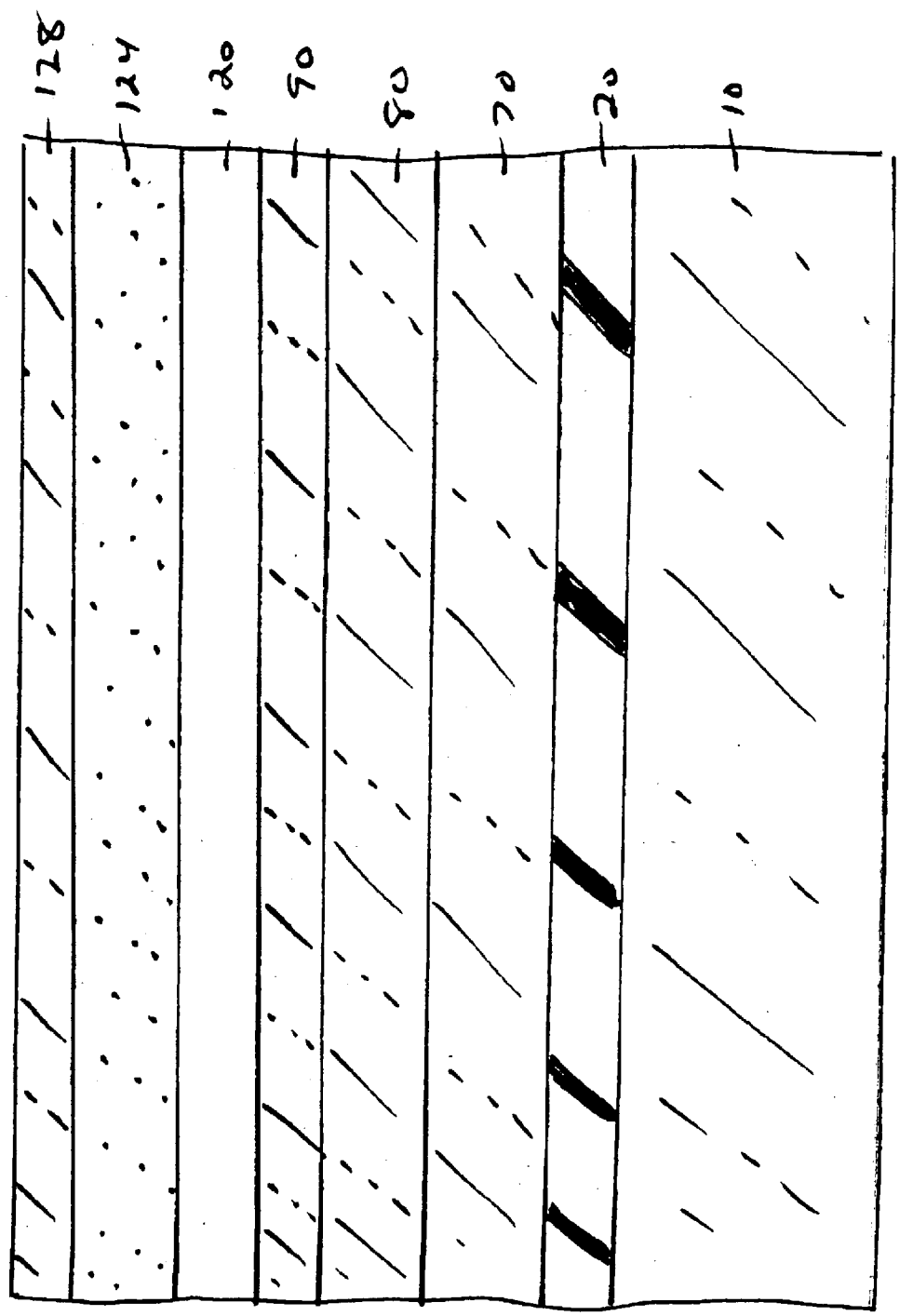
FIG. 8 is a schematic of a cross-sectional view of an n-type modulation doped FET (MODFET) structure deposited on the structure of FIG. 4.

FIG. 8 shows an embodiment of the present invention wherein an n-type MODFET structure is formed on the structure shown in FIG. 4 using processing steps well known in the art. The structure shown in FIG. 8 comprises pseudomorphic tensile strained Si layer 90, SiGe layer 120 of the same composition as layer 80, n+ doped SiGe layer 124 of otherwise the same composition as layer 120, and pseudomorphic, strained Si cap 128.

Figure 9:
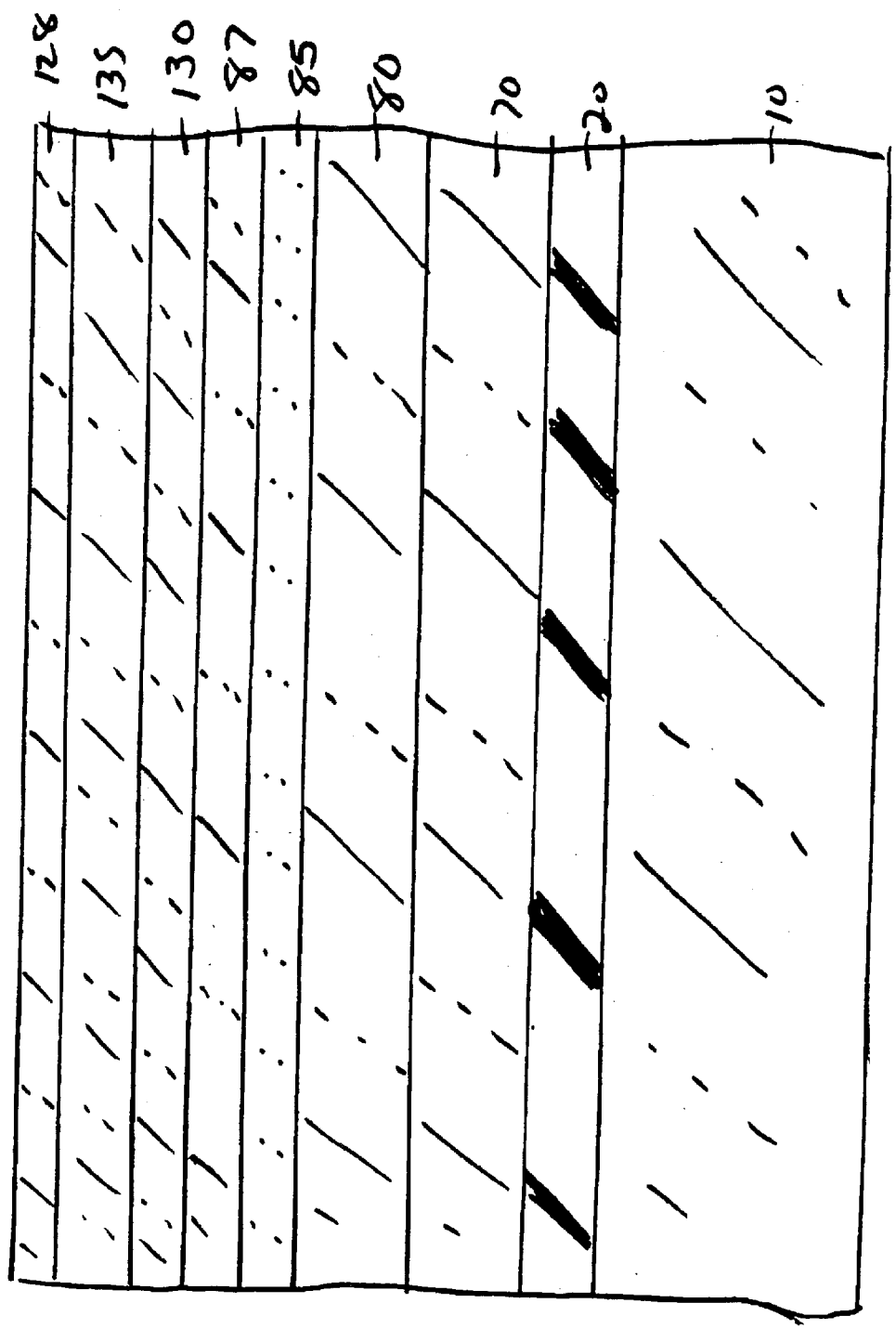
FIG. 9 is a schematic of a cross-sectional view of a p-type MODFET structure deposited on the structure of FIG. 4.

FIG. 9 illustrates a p-type MODFET structure formed on the structure of FIG. 4. The structure shown in FIG. 9 comprises p+ doped SiGe layer 85 of the same composition as layer 80, SiGe layer 87 having the same composition as layer 80, pseudomorphic compressively strained SiGe layer 130 with a Ge content that is substantially higher than that of layer 80, SiGe layer 135 of the same composition as layer 80, and a pseudomorphic Si cap 128. The structure can also optionally be built directly upon layer 70 without layer 80.

Figure 10:
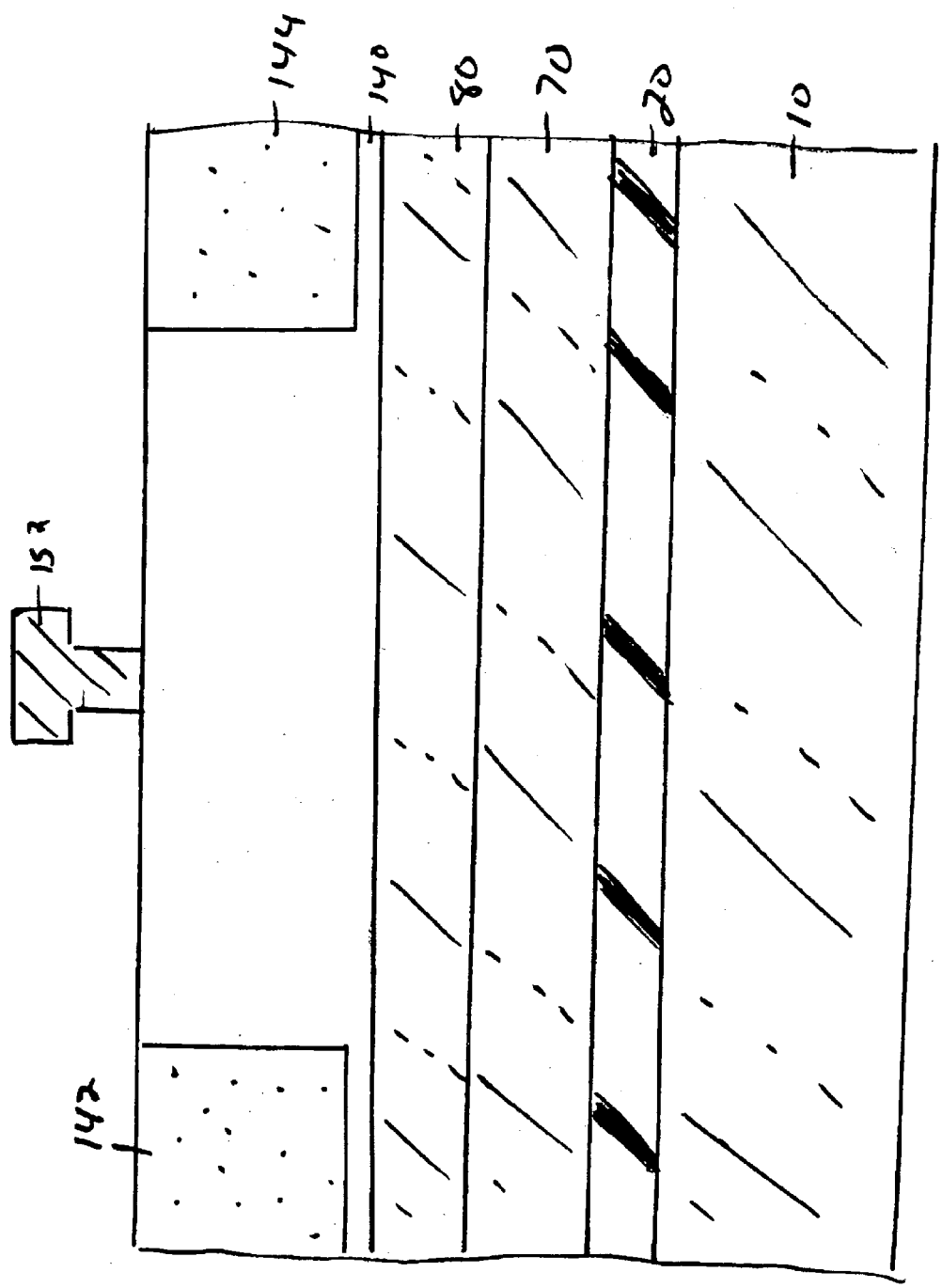
FIG. 10 is a schematic of a cross-sectional view of a structure wherein a MODFET device is fabricated on the structure of FIG. 8 or FIG. 9.
Figure 11:
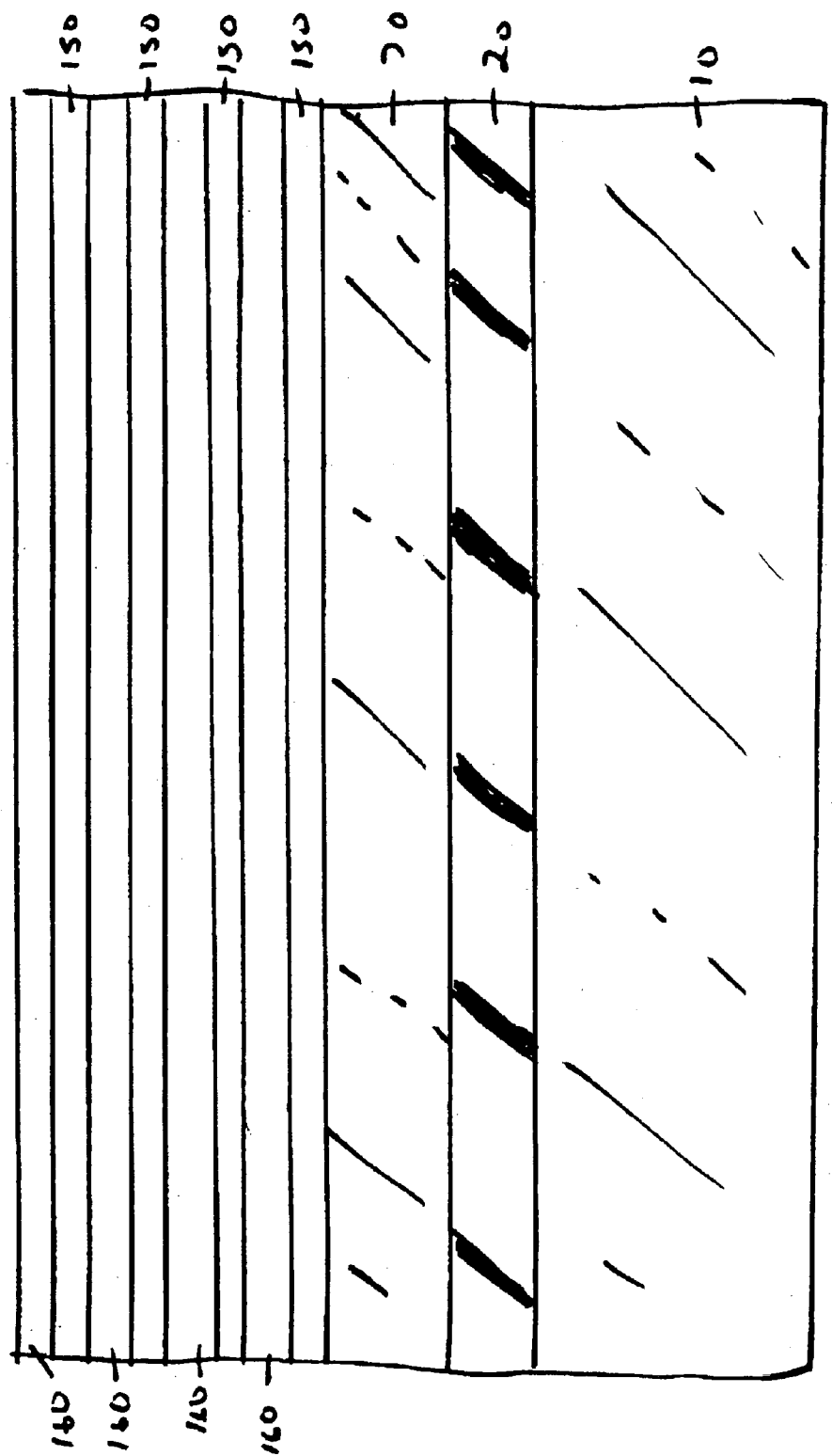
FIG. 11 is a schematic view of a cross-sectional view of a structure comprising a superlattice consisting of alternating layers 150 and 160 deposited atop the structure of FIG. 2.
Figure 12:
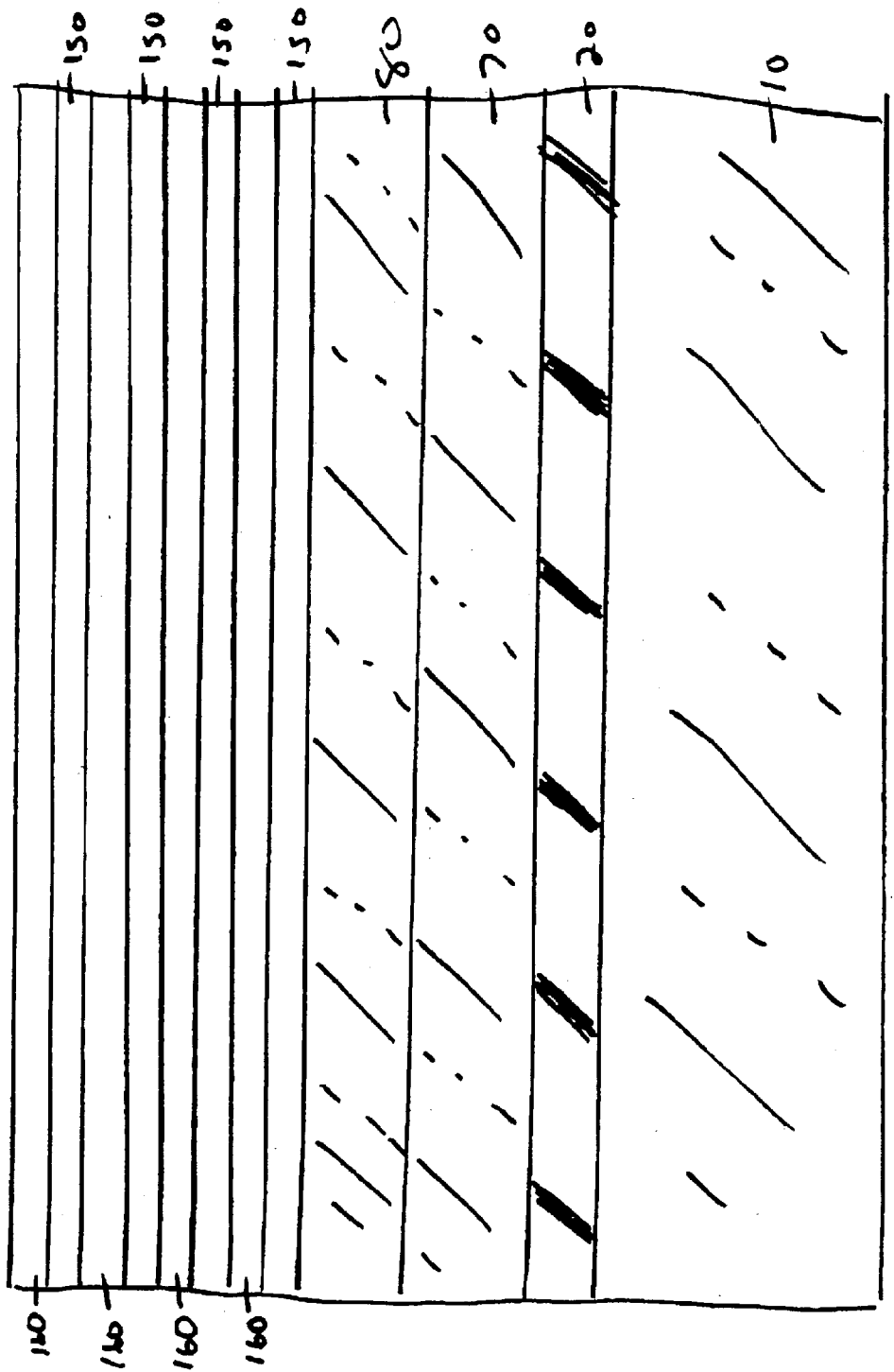
FIG. 12 is a schematic view of a cross-sectional of a structure comprising a superlattice consisting of alternating layers 150 and 160 deposited atop the structure of FIG. 4.

FIG. 10 shows a structure wherein a MODFET device is fabricated on the structures of FIG. 8 or FIG. 9. In this figure, layer 140 comprises all the layers above layer 80 as described in FIGS. 8 and 9. The MODFET further comprises source/drain diffusion regions 142 and 144, and T-gate 152.

In other embodiments of the present invention, superlattice structures can be formed atop the structures shown in FIGS. 2 and 4 described above, See FIGS. 11 and 12. In each of these figures alternating layers (150 and 160) of $Si_{1-x-y}Ge_xC_y$ (i.e., layer 150) and $Si_{1-z-w}Ge_zC_w$ (i.e., layer 160), wherein x and y are different from z and w, respectively, and x and y can be equal to 0, can be formed atop the base structure. Such superlattice structures can be used to fabricate thermoelectric cooling elements that can be integrated with semiconductor devices to improve their performance.

The present invention also provides integrated circuits (ICs) which include at least the inventive single crystalline relaxed SiGe layer. In one embodiment, the IC comprises Si substrate 10 having a top surface; first insulating layer 20 atop of substrate 10; first optional intermediate layer 65 comprising a single crystalline relaxed SiGe layer of graded composition formed atop first insulating layer 20; first single crystalline relaxed SiGe layer 70 atop optional intermediate layer 65 or first insulating layer 20, wherein said first single crystalline relaxed SiGe layer has a uniform composition, is less than 200 nm thick, and has a threading dislocation density of less than about $10^7$ cm$^{-2}$; homo-epitaxial SiGe layer 80 formed atop layer 70; a strained single crystalline Si layer 90 grown pseudomorphically on homo-epitaxial SiGe layer 80; SiGe layer 120 of the same composition of layer 80 formed atop layer 90; single crystalline n+ doped and relaxed SiGe layer 124 formed atop layer 120; strained single crystalline Si layer 128 grown pseudomorphically on said single crystalline n+ doped and relaxed SiGe layer; and at least one semiconductor device built in said layers. Such a structure is shown, for example, in FIG. 8.

In another embodiment of the present invention, the IC comprises Si substrate 10 having a top surface; first insulating layer 20 atop of substrate 10; first optional intermediate layer 65 comprising a single crystalline relaxed SiGe layer of graded composition; first single crystalline relaxed SiGe layer 70 atop optional intermediate layer 65 or first insulating layer 20, wherein said first single crystalline relaxed SiGe layer has a uniform composition, is less than 200 nm thick, and has a threading dislocation density of less than about $10^7$ cm$^{-2}$; homo-epitaxial SiGe layer 80 formed atop layer 70; single crystalline p+doped homo-epitaxial SiGe layer 85 formed atop said homo-epitaxial SiGe layer; SiGe layer 87 of the same composition as layer 80 formed atop layer 85; compressively strained pseudomorphic single crystalline SiGe layer 130 formed on said homo-epitaxial single crystalline SiGe layer and having a Ge concentration significantly higher than layer 85; single crystalline SiGe layer 135 formed on said compressively strained single crystalline SiGe layer and having the same composition as layer 85; layer of strained single crystalline Si 128 grown pseudomorphically on said single crystalline Si layer; and at least one semiconductor device built in said layers. Such a structure is shown, for example in FIG. 9.

Another IC structure of the present invention comprises a Si substrate having a top surface; a first insulating layer atop of said Si substrate; an optional intermediate layer comprising a single crystalline relaxed SiGe layer of graded composition; a first single crystalline relaxed SiGe layer atop said optional intermediate layer or said first insulating layer, wherein said first single crystalline relaxed SiGe layer has a uniform composition, is less than 200 nm thick, and has a threading dislocation density of less than about $10^7$ cm$^{-2}$; a layer of strained single crystalline Si grown pseudomorphically on said first single crystalline relaxed SiGe layer; and at least one semiconductor device such as a FET built in said layers. Such a structure is shown, for example, in FIG. 7.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of forming at least one relaxed SiGe buffer layer on a silicon-on-insulator substrate comprising the steps of:
   (a) forming a layer of self-assembled Ge or SiGe islands atop a Ge wetting layer which is formed atop a Si layer of a silicon-on-insulator substrate;
   (b) forming a planarizing Si or Si-rich SiGe cap layer which covers the layers of Ge or SiGe islands; and
   (c) annealing the silicon-on-insulator substrate containing said planarizing Si or Si-rich SiGe cap layer covering said layer of Ge or SiGe islands so as to intermix said planarizing Si or Si-rich cap layer, said layer of Ge or SiGe islands and said top Si layer of the silicon-on-insulator substrate to relieve strain therein, thereby obtaining a homogeneous strain-relaxed SiGe layer having a low density of threading dislocations.

2. The method of claim 1 wherein steps (a) and (b) are carried out using a high or ultra-high vacuum deposition process selected from the group consisting of molecular beam epitaxy, chemical vapor deposition, plasma-enhanced chemical vapor deposition, plating, evaporation, sputtering, chemical beam epitaxy and chemical solution deposition.

3. The method of claim 1 wherein said layer of Ge or SiGe islands has a content of Ge ranging from about 30 to about 100 atomic percent.

4. The method of claim 3 wherein said layer of Ge or SiGe islands has a content of Ge ranging from about 40 to about 100 atomic percent.

5. The method of claim 1 wherein said layer of Ge or SiGe islands has a thickness of from about 5 to about 80 nm.

6. The method of claim 1 wherein step (a) is performed using chemical vapor deposition, said chemical vapor deposition being carried out at a deposition temperature of from about 300° to about 900° C. and at a growth rate of from about 0.5 to about 5 Å/sec.

7. The method of claim 1 wherein step (a) is performed using molecular beam epitaxy, said molecular beam epitaxy being carried out at a deposition temperature of from about 400° to about 800° C. and at a growth rate of from about 0.1 to about 1 Å/sec.

8. The method of claim 1 wherein said planarizing Si or Si-rich cap layer comprises from about 0 to about 10 atomic percent Ge.

9. The method of claim 8 wherein said planarizing Si or Si-rich cap layer comprises from about 0 to about 5 atomic percent Ge.

10. The method of claim 1 wherein said planarizing Si or Si-rich cap layer has a thickness of from about 6 to about 100 nm.

11. The method of claim 10 wherein said planarizing Si or Si-rich cap layer has a thickness of from about 8 to about 81 nm.

12. The method of claim 1 wherein said annealing is performed in an inert gas ambient, an oxidizing ambient or a forming gas.

13. The method of claim 1 wherein said annealing is performed at a temperature of from about 400° to about 1400° C.

14. The method of claim 13 wherein said annealing is performed at a temperature of from about 800° to about 1250° C.

15. The method of claim 1 wherein said annealing is carried out using rapid thermal annealing conditions.

16. The method of claim 1 wherein said homogeneous strain-relaxed SiGe layer has a threading dislocation density of less than about $10^7$ cm$^{-2}$.

17. The method of claim 16 wherein said homogeneous strain-relaxed SiGe layer has a threading dislocation density of from about $10^3$ to about $10^6$ cm$^{-2}$.

18. The method of claim 1 wherein said homogeneous strain-relaxed SiGe layer comprises from about 5 to about 40 atomic percent Ge.

19. The method of claim 18 wherein said homogeneous strain-relaxed SiGe layer comprises from about 15 to about 35 atomic percent Ge.

20. The method of claim 1 Wherein said homogeneous strain-relaxed SiGe layer comprises a single crystalline SiGe layer.

21. The method of claim 1 wherein said homogeneous strain-relaxed SiGe layer has a thickness of from about 15 to about 200 nm.

22. The method of claim 1 wherein steps (a)–(c) are repeated any number of times.

23. The method of claim 1 wherein steps (a)–(b) are repeated any number of times prior to conducting step (c).

24. A method of forming a relaxed SiGe buffer layer on a silicon-on-insulator substrate comprising the steps of:

(a) forming a C-nucleation layer on top of a Si layer of a silicon-on-insulator substrate;

(b) forming a layer of self-assembled Ge or SiGe islands on said C-nucleation layer;

(c) forming a planarizing Si or Si-rich SiGe cap layer which covers the layer of Ge or SiGe islands; and (d) annealing the silicon-on-insulator substrate containing said planarizing Si or Si-rich SiGe cap layer covering said layer of Ge or SiGe islands so as intermix said layers to relieve strain therein, thereby obtaining a homogeneous strain-relaxed SiGe layer having a low density of threading dislocations.

25. The method of claim 24 wherein said C-nucleation layer has a thickness of about 1 monolayer or less.

26. The method of claim 24 wherein said layer of Ge or SiGe islands has a content of Ge ranging from about 30 to about 100 atomic percent.

27. The method of claim 24 wherein said layer of Ge or SiGe islands has a thickness of from about 3 to about 30 nm.

28. The method of claim 24 wherein step (b) is performed using chemical vapor deposition, said chemical vapor deposition being carried out at a deposition temperature of from about 300° to about 900° C. and at a growth rate of from about 0.5 to about 5 Å/sec.

29. The method of claim 24 wherein step (b) is performed using molecular beam epitaxy, said molecular beam epitaxy being carried out at a deposition temperature of from about 400° to about 800° C. and at a growth rate of from about 0.1 to about 1 Å/sec.

30. The method of claim 24 wherein said planarizing Si or Si-rich cap layer comprises from about 0 to about 10 atomic percent Ge.

31. The method of claim 24 wherein said planarizing Si or Si-rich cap layer has a thickness of from about 4 to about 50 nm.

32. The method of claim 24 wherein said annealing is performed in an inert gas ambient or a forming gas.

33. The method of claim 24 wherein said annealing is performed at a temperature of from about 400° to about 1400° C.

34. The method of claim 24 wherein said homogeneous strain-relaxed SiGe layer has a threading dislocation density of less than about $10^7$ cm$^{-2}$.

35. The method of claim 24 wherein said homogeneous strain-relaxed SiGe layer has a threading dislocation density of from about $10^3$ to about $10^6$ cm$^{-2}$.

36. The method of claim 24 wherein said homogeneous strain-relaxed SiGe layer comprises from about 5 to about 40 atomic percent Ge.

37. The method of claim 24 wherein said homogeneous strain-relaxed SiGe layer comprises from about 15 to about 35 atomic percent Ge.

38. The method of claim 24 wherein said homogeneous strain-relaxed SiGe layer comprises a single crystalline SiGe layer.

39. The method of claim 24 wherein said homogeneous strain-relaxed SiGe layer has a thickness of from about 15 to about 200 nm.

* * * * *

UNITED STATES PATENT AND TRADEMARK OFFICE
CERTIFICATE OF CORRECTION

PATENT NO. : 6,833,332 B2
DATED : December 21, 2004
INVENTOR(S) : Silke H. Christiansen et al.

It is certified that error appears in the above-identified patent and that said Letters Patent is hereby corrected as shown below:

<u>Column 5,</u>
Line 59, "thee" should read -- the --

<u>Column 11,</u>
Line 27, "Wherein" should read -- wherein --

Signed and Sealed this

Seventh Day of June, 2005

JON W. DUDAS
*Director of the United States Patent and Trademark Office*